United States Patent [19]

Parsels

[11] 3,961,003
[45] June 1, 1976

[54] METHOD AND APPARATUS FOR MAKING ELONGATED SI AND SIC STRUCTURES

[75] Inventor: David L. Parsels, Carrollton, Ky.

[73] Assignee: Dow Corning Corporation, Midland, Mich.

[22] Filed: Feb. 4, 1974

[21] Appl. No.: 439,165

Related U.S. Application Data

[63] Continuation of Ser. No. 254,183, May 17, 1972, abandoned.

[52] U.S. Cl. .................................. 264/81; 249/175; 264/338
[51] Int. Cl.² ..................... B29C 13/00; B28B 7/28
[58] Field of Search ...................... 264/81, 337, 338; 52/731, 728; 117/106 R, 106 A; 425/460, 469; 249/134, 135, 175

[56] References Cited
UNITED STATES PATENTS

| | | | |
|---|---|---|---|
| 1,752,103 | 3/1930 | Morrison | 52/731 |
| 2,271,995 | 2/1942 | Baroni | 264/81 |
| 2,999,735 | 9/1961 | Reuschel | 264/81 |
| 3,476,640 | 11/1969 | Sirtl et al. | 264/81 |
| 3,576,932 | 4/1971 | Biddulph | 264/81 |
| 3,609,829 | 10/1971 | Carrell et al. | 264/81 |
| 3,686,378 | 8/1972 | Dietze | 264/81 |
| 3,806,570 | 4/1974 | Flamenbaum et al. | 264/81 |
| 3,862,020 | 1/1975 | Woerner et al. | 264/81 |

Primary Examiner—Donald J. Arnold
Attorney, Agent, or Firm—Howard W. Hermann

[57] ABSTRACT

Method for making elongated structures such as furnace tubes having at least one flat side from vapor deposited silicon or silicon carbide using a graphite mandrel having a plurality of elongated edge-mated elements held in place by end collars to which an electrical power source is connected. Rectangular tubes can be sawed apart to produce flat plates if desired.

8 Claims, 4 Drawing Figures

METHOD AND APPARATUS FOR MAKING ELONGATED SI AND SIC STRUCTURES

This is a continuation of application Ser. No. 254,183, filed May 17, 1972, and now abandoned.

BACKGROUND OF THE INVENTION

The present invention relates to methods and apparatus for making elongated structures of silicon and silicon carbide, and more particularly structures having at least one flat side.

It has been known for many years that vapor deposited silicon carbide structures such as rods and tubes can be made by vapor depositing silicon carbide on a heated form of material capable of withstanding the deposition temperatures. For example, U.S. Pat. No. 3,157,541 (Heywang et al.), U.S. Pat. No. 3,011,877 (Schweickert et al.), U.S. Pat. No. 3,350,182 (Hunter et al.), and U.S. Pat. No. 3,397,448 (Tucker) all describe methods of this sort. Various other examples exist in the prior art. Silicon carbide structures are particularly useful in atmospheres where high temperatures or chemical inertness are desirable characteristics.

More recently it has been suggested that semiconductor grade silicon be formed in tubular shapes for use, for example, as furnace tubes in the processing of semiconductor materials. The silicon tubes have been made in much the same manner as the previously suggested methods for producing silicon carbide tubes, i.e., depositing silicon from the vapor phase on a heated rod of compatible material. The aforementioned Schweickert et al. patent describes deposition of silicon on a heated carrier from silicon containing gases as does U.S. Pat. No. 2,999,735 (Reuschel). This method for the deposition of silicon upon a heated carrier has become virtually the standard method for production of semiconductor grade silicon both in the United States and abroad.

The manufacture of furnace tubes of silicon and silicon carbide is generally made using graphite as the substrate material for deposition. After deposition to the desired wall thickness the graphite is removed and in most cases is not reusable. Accordingly, for purposes of economy the cheapest possible form of graphite suitable for the purpose is desirable. It has been found that there are advantages in using furnace tube configurations which have at least a flat bottom portion or which have a rectangular cross section. This has been accomplished by machining of either the graphite form or the finished tube both of which result in substantial waste of materials and time.

SUMMARY OF THE PRESENT INVENTION

Accordingly, it is an object of the present invention to provide a method and apparatus for manufacture of elongated structures, such as furnace tubes having at least one flat side, from vapor deposited silicon or silicon carbide in a manner which offers greater efficiency and economies in time and materials than those heretofore proposed.

In accordance with this and other objects there is provided by the present invention a method which comprises forming a graphite mandrel by forming mating surfaces on the edges of a plurality of graphite elements of equal length at least one of the elements being a flat slab. The elements are placed in the configuration of the structure desired with the mating surfaces in mated relationship and secured in position by a pair of electrically conductive collars surrounding and in intimate contact with the end portions of the mated elements. The collars are connected to an electrical power source to cause heating of the graphite mandrel and deposition of the silicon or silicon carbide on the heated mandrel from the vapor phase is carried out in a suitable reaction chamber. The mandrel is then removed from the deposited material resulting in the structure desired.

In the case of a rectangular tubular configuration, four graphite slabs can be utilized to produce the mandrel. The only waste involved is in machining of the joints between the slabs to assure tight fit and rigid connection, and therefore a minimum of graphite is wasted. Furthermore, rectangular tubes of silicon and silicon carbide can be sawed to make flat slabs for use, for example, in diffusion of impurities into semiconductor wafers in semiconductor device manufacture. Machining and danger of slab cracking during machining are virtually eliminated. Other objects and advantages of the present invention will become apparent to those skilled in the art from a reading of the following detailed description when read in connection with the accompanying drawings.

DESCRIPTION OF PREFERRED EMBODIMENTS

Figure 1:
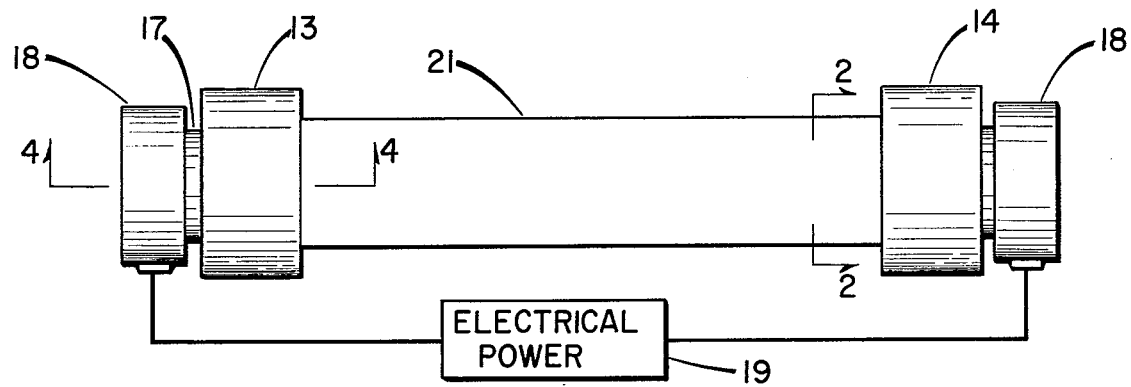
FIG. 1 is a partly diagrammatic elevational view of apparatus according to the present invention.
Figure 2:
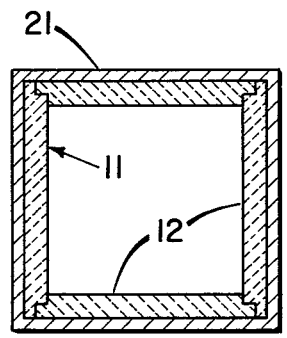
FIG. 2 is a cross-sectional view taken along the line 2—2 of FIG. 1.

Referring now to the drawings wherein like reference characters designate like or corresponding parts throughout the figures thereof, there is shown in FIG. 1 a mandrel shown generally as 11 which as may be seen more clearly from FIG. 2 is made up of a plurality of graphite slabs 12 having mated edge portions to form a unitary structure. It should be realized while in FIG. 2 the configuration of the mandrel 11 is square and therefore all elements 12 thereof are identical, the configuration may have any desired number of elements of different configurations as long as one is substantially flat to form a base for the structure desired. For example, the configuration may be made up of two elements; one flat and a second semi-circular in cross-section. Similarly the configuration may be made triangular by utilizing three flat elements. Other configurations are also, of course, possible.

Figure 3:
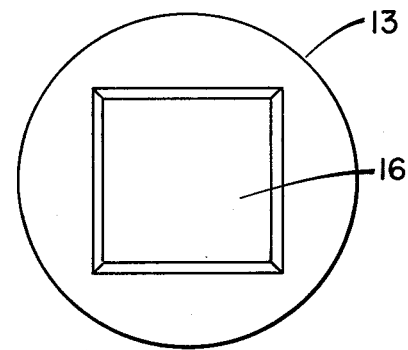
FIG. 3 is an end view in elevation of one of the collars shown in the configuration of FIG. 1.

The elements are held in place by a pair of collars 13, 14 which are mirror images of one another. The collars can be understood in greater detail with references to FIGS. 3 and 4. The interior opening 16 of the collar 13 is provided with tapered walls to provide a wedging action against a similar taper provided on the ends of each of the elements 12. Thus as the collar is pressed on to the ends of the elements 12 there is secure clamping action and intimate electrical connection is made between the collar 13 and the elements 12. Similarly, the opposite ends of the elements 12 and the opening in the collar 14 are provided with tapered walls to give the same effect. The collars 13 and 14 are preferably made of the same graphite as that used in the elements 12.

The collars 13 and 14 are also provided with a tapered male portion 17 extending in a direction opposite that portion of the collar which holds the elements 12. A tapered contact ring 18 is provided in press fit connection on the male portion 17. The electrical contact rings 18 affixed to the collars 13 and 14 are connected to a suitable source of electrical power 19 to provide for heating of the configuration to be coated.

Figure 4:
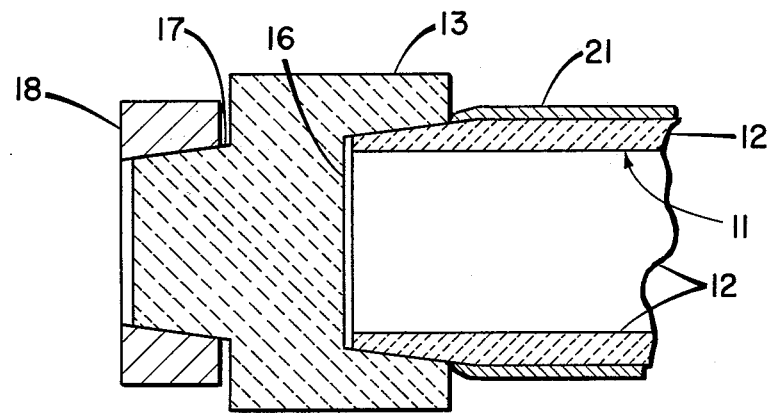
FIG. 4 is a fragmentary cross-sectional view taken along the line 4—4 of FIG. 1 showing greater detail of the collar and electrical connections to the collar.

The assembled unit of FIG. 1 is placed within a reaction chamber and a suitable gas supply is provided to cause deposition of silicon or silicon carbide as desired on the mandrel 11. If desired, the collars 13 and 14 and parts exterior thereof may be kept outside of the reaction chamber but due to the electrical conductivity of the greater bulk of material in the collars 13 and 14 a smaller amount of heating of these elements will take place per unit of surface area and only minimum deposition of material will take place thereon. The deposited silicon or silicon carbide can be seen in the drawings in FIGS. 2 and 4 represented by the numeral 21. Deposition is maintained until the desired thickness of the final configuration is reached whereupon the electrical power is disconnected, and the mandrel 11 with the coating thereon is removed from the deposition chamber. Upon cooling the graphite tends to separate from the silicon or silicon carbide so that the graphite may be simply broken away from the external tube. Some grades of graphite, however, tend to adhere to the coated material and must be removed by means such as oxidation.

If slabs of silicon or silicon carbide are desired the rectangular tube can be sawed apart at its corners resulting in flat slabs needing no further machining. Prior art methods of making such slabs generally made use of machining of ingots, adding expense in labor and material waste. Additionally, cracking was a substantial problem. Deposition on a flat plate tended to cause warping which is eliminated by the inherent rigidity of the tubular configuration of the present invention.

The particular vapor phase reactants for production of silicon and silicon carbide are well known in the art as evidenced by the aforementioned prior art patents as are conditions for deposition. In general, for silicon production the preferred reactants are trichlorosilane, silicon tetrachloride, or mixtures thereof carried in a hydrogen stream, or alternatively, monosilane ($SiH_4$) may be used. The preferred temperature range for the silicon chlorides is between 1000° and 1150°C. Monosilane may be decomposed at slightly lower temperatures.

For silicon carbide production the preferred reactants are alkyl silanes such as dimethyldichlorosilane, mixtures of monomethyl- and dimethyl-chlorosilanes, and trimethylmonochlorosilane. Further, mixtures of trichlorosilane or silicon tetrachloride with hydrocarbon gases such as methane may be used. Silicon carbide is deposited from these materials at temperatures between about 1150°C. and 1400°C. It is further possible to deposit silicon carbide as a reaction product of a gas such as silicon monoxide and the graphite which forms the mandrel at temperatures of about 2000°C.

While the invention has been described with respect to tubes, it should be understood that other configurations of elongated bodies having a non-circular cross-section can be made using a similar method and apparatus to that described above. For example, crucibles can be made by eliminating the top member of the mandrel. It is also possible to eliminate the electrical connection to the collars and use induction heating for heating of the mandrel. In such case the collars act only as retainers for the mandrel elements. Various other modifications and variations of the invention will occur to those skilled in the art from a reading of the foregoing. Accordingly, it is to be understood that within the scope of the appended claims the invention may be practiced otherwise than as specifically described.

In a specific embodiment of the invention in which a square tube of silicon was made, the four graphite slabs constituting the mandrel were each of 1 15/16 inches in width and 24 inches long by ⅛ inch in thickness. The edges of the slabs were rabbeted 1/16 inch and 1 inch at each end was tapered with a 1 in 10 taper. The outside diameter of the circular collar was 3¼ inches and the collar opening was 2 inches tapered 1 in 10 over its 1 inch depth. The tapered male portion of the collar also had a 1 in 10 taper and was 1¼ inches in diameter at its base. The collar was 1¾ inches in length and the male portion extended an additional 1 inch. A solid copper contact ring having a diameter of 2 inches and a tapered hole matching the dimensions of the male portion of the collar was fitted thereon. Th unit was placed in a reaction chamber and heated to a temperature of 1090°C. and maintained at that temperature for 10 hours in the presence of trichlorosilane and hydrogen mixed in a ratio in the range of 15:1 and 20:1 which resulted in a square tube having walls of silicon ranging in thickness between 6 and 8 millimeters.

That which is claimed is:

1. A method of making a one-piece elongated structure of vapor deposited silicon or silicon carbide, said structure having at least one flat side in the direction of elongation, which method comprises Forming a graphite mandrel having an axis by forming mating surfaces on the edges of a plurality of elongated graphite elements having equal lengths and having end portions at each end thereof, said end portions being transverse to the edges having said mating surfaces, at least one of said elements being a flat slab all of the elements having an external surface facing away from the axis of the mandrel; placing the elements in the configuration of the structure desired with said mating surfaces in mated relationship, and securing the mated elements in mated position by a pair of collars surrounding and in intimate contact with the end portions of said mated elements, Heating of the graphite mandrel to the range of 1,000°–2,000°C.

Depositing said silicon or silicon carbide on said external surface of said heated mandrel from the vapor phase, and Removing the mandrel from the deposited material.

2. A method as defined in claim 1 wherein said collars are electrically conductive and said collars are connected to an electrical power source to cause heating of the mandrel.

3. A method as defined in claim 2 and further including forming corresponding tapers on the exterior surfaces of the ends of said elements and the interior surfaces of said collars whereby intimate electrical contact between the collar and said elements is assured.

4. Apparatus for forming one-piece elongated structures of vapor deposited silicon or silicon carbide comprising A graphite mandrel having a plurality of elongated graphite elements of equal lengths and having edge portions along the entire lengths thereof and having end portions transverse to said edge portions, at least one of said elements being a flat slab; said elements having mating surfaces at the edge portions thereof and being held together with said mating surfaces in mating relationship by a pair of collars surrounding and in intimate contact with the end portions of said mated elements, and Heating means for heating said mandrel.

5. Apparatus as defined in claim 4 wherein said collars are electrically conductive and said heating means includes an electrical power source connected across said collars.

6. Apparatus as defined in claim 5 wherein the exterior surfaces of the ends of said elements are tapered and the interior surfaces of said collars have a corresponding taper whereby press fitting of said collars onto said elements insures intimate contact between said collars and elements.

7. Apparatus as defined in claim 6 wherein each of said collars is provided with a tapered male portion extending in a direction opposite the portion holding said elements and a tapered electrical contact ring is fitted on said male portion, said electrical power source being connected to said contact ring.

8. Apparatus as defined in claim 6 wherein said elements are all rectangular slabs and said mandrel is of rectangular configuration.

* * * * *